US006753591B2

United States Patent
Yu

(12) United States Patent
(10) Patent No.: US 6,753,591 B2
(45) Date of Patent: Jun. 22, 2004

(54) LOW SUBSTRATE LOSS INDUCTOR

(75) Inventor: Jay Yu, Taipei Hsien (TW)

(73) Assignee: VIA Technologies Inc., Hsien Tien (TW)

(*) Notice: Subject to any disclaimer, the term of this patent is extended or adjusted under 35 U.S.C. 154(b) by 0 days.

(21) Appl. No.: 10/249,495

(22) Filed: Apr. 15, 2003

(65) Prior Publication Data
US 2004/0094822 A1 May 20, 2004

(30) Foreign Application Priority Data
Nov. 15, 2002 (TW) .......................................... 91133558 A

(51) Int. Cl.[7] .............................................. H01L 29/00
(52) U.S. Cl. ....................................................... 257/531

(58) Field of Search ................................. 257/351–365, 257/531; 438/153–154

(56) References Cited

U.S. PATENT DOCUMENTS 6,452,249 B1 * 9/2002 Maeda et al. ............... 257/531

* cited by examiner

Primary Examiner—Cuong Nguyen
(74) Attorney, Agent, or Firm—Winston Hsu

(57) ABSTRACT

A low substrate loss inductor has a substrate, a plurality of p type doping areas and a plurality of n type doping areas formed alternatively inside the substrate, an insulating layer formed on the substrate, and a metal coil formed on the insulation layer. The insulation layer isolates the metal coil from the p type doping areas and n type doping areas. The doping areas are arranged orthogonal to the metal coil.

20 Claims, 11 Drawing Sheets

US 6,753,591 B2

LOW SUBSTRATE LOSS INDUCTOR

BACKGROUND OF INVENTION

1. Field of the Invention

The present invention relates to an inductor, and more particularly, to a low substrate loss inductor manufactured by semiconductor IC technologies.

2. Description of the Prior Art

Passive elements, such as inductors or transformers, are widely used in microwave or high frequency wireless communication circuits. With the progress of semiconductor IC technologies and the requirement of small-sized, low-cost, and highly integrated systems, passive elements are integrated gradually in a single chip. Inductive elements are generally designed on a substrate with high impedance or on a substrate without energy loss, such as, a gallium arsenide (GaAs) substrate, for obtaining high quality factor and high self-resonance frequency inductors. However, because of the high cost, a low impedance silicon substrate (resistivity from 0.01 to 10 ohm-cm) is generally used to reduce the chip cost.

Please refer to FIG. 1 to FIG. 3. FIG. 1 is a schematic diagram of a silicon substrate inductor 13 of the prior art. FIG. 2 is a cross-sectional diagram of the silicon substrate inductor 13 shown in FIG. 1 along line 2—2. FIG. 3 is a schematic diagram of an equivalent circuit of the silicon substrate inductor 13 shown in FIG. 1. $L_s$ and $R_s$ represent the inductance and the resistance of the inductor 14 respectively, $C_{ox}$ is the parasitic capacitance between the inductor 14 and the substrate 10, and $C_{sub}$ and $R_{sub}$ represent the parasitic capacitance and the resistance generated by the substrate 10. As shown in FIG. 1 and FIG. 2, the inductor 14 is formed by a spiral metal coil, and an insulation layer 12 is installed between the inductor 14 and the substrate 10 to isolate the inductor 14 and the substrate 10. Generally the material of the isolation layer is silica ($SiO_2$). The inductor 14 comprises two ends, wherein the current flows in from one end and flows out from the other. If the current of the inductor 14 flows clockwise, a magnetic field that passes through the substrate 10 will be generated, therefore a counterclockwise image current (also called eddy current) 18 will be generated on the substrate 10. The image current 18 will result in energy loss.

Please refer to FIG. 4 to FIG. 6. FIG. 4 is a schematic diagram of a patterned ground shield (PGS) inductor 21. FIG. 5 is a cross-sectional diagram of the inductor 21 shown in FIG. 5 along line 5—5. FIG. 6 is a schematic diagram of an equivalent circuit of the inductor 21 shown in FIG. 4. For simplifying description, same index numbers are used to indicate same elements in the figures. Because the image current 18 causes energy loss, a PGS 16 is formed by a polysilicon or a metal layer between the inductor 14 and the substrate 10 to avoid the energy loss as shown in FIG. 4 and FIG. 5. The banded conductive wires of the PGS 16 are separated by trenches and arranged orthogonal to the direction of current flow of the inductor 14 so that the image current 18 generated by the magnetic field of the inductor 14 can be avoided. Further the energy loss of the substrate 10 can be reduced and the quality factor of the inductor 14 can be increased. The PGS 16 can avoid the image current 18 generated by the magnetic field of the inductor 14. However, the distance between the inductor 14 and the PGS 16 is shortened, that enlarges the parasitic capacitance of the inductor 14, decreases the self-resonance frequency of the inductor 14, and reduces the frequency application range of the inductor 14. Because $C_{ox}$ enlarges, the parasitic capacitance of a PSG inductor is larger than the parasitic capacitance of a silicon substrate inductor of the prior art. Moreover, the self-resonance frequency is inversely proportional to the square root of the product of parasitic capacitance and inductance of the inductor 14, therefore the higher the parasitic capacitance and the inductance are, the less the self-resonance frequency of the inductor 14 is.

Thus it can be seen that in the silicon substrate inductor 13 of the prior art, the image current 18 generated by the magnetic field of the inductor 14 would cause energy loss that will reduce the quality factor of the inductor 14. Though the PGS 16 formed by a polysilicon or metal layer can avoid the image current 18 generated by the magnetic field of the inductor 14, it also reduces the distance between the inductor 14 and the PGS 16, that enlarges the parasitic capacitance of the inductor 14. The enlargement of the parasitic capacitance would decrease the self-resonance frequency of the inductor 14, and reduce the frequency application range of the inductor 14.

SUMMERY OF INVENTION

It is therefore a primary object of the claimed invention to provide a low substrate loss inductor manufactured by IC technologies to solve the above-mentioned problem.

According to the claimed invention, an inductor comprising a substrate, a plurality of P-type and N-type doping strips alternatively formed inside the substrate, an isolation layer formed on the substrate, and a metal coil formed on the isolation layer is provided. The isolation layer isolates the metal coil and the plurality of P-type and N-type doping strips, and the plurality of P-type and N-type doping strips is arranged orthogonal to the metal coil.

These and other objects of the present invention will no doubt become obvious to those of ordinary skill in the art after having read the following detailed description of the preferred embodiment that is illustrated in the various figures and drawings.

DETAILED DESCRIPTION

Figure 1:
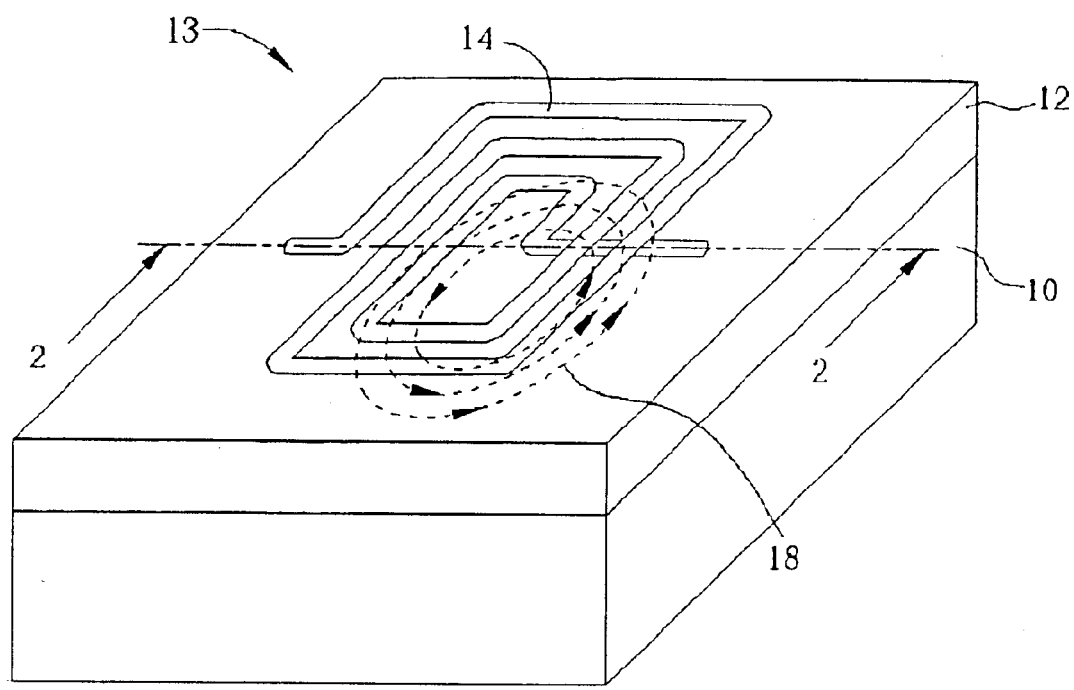
FIG. 1 is a schematic diagram of a silicon substrate inductor of the prior art.
Figure 2:
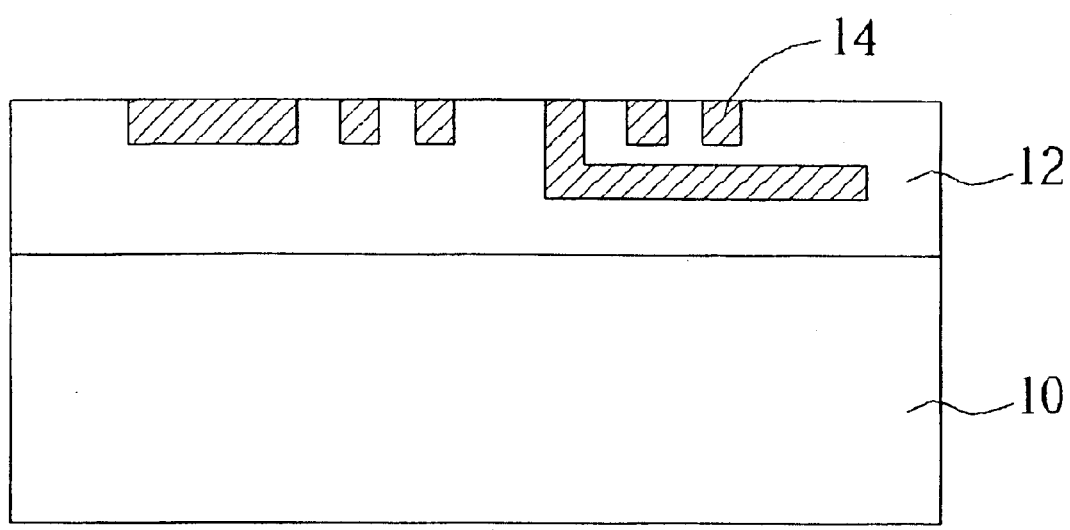
FIG. 2 is a cross-sectional diagram of the silicon substrate inductor shown in FIG. 1 along line 2—2.
Figure 3:
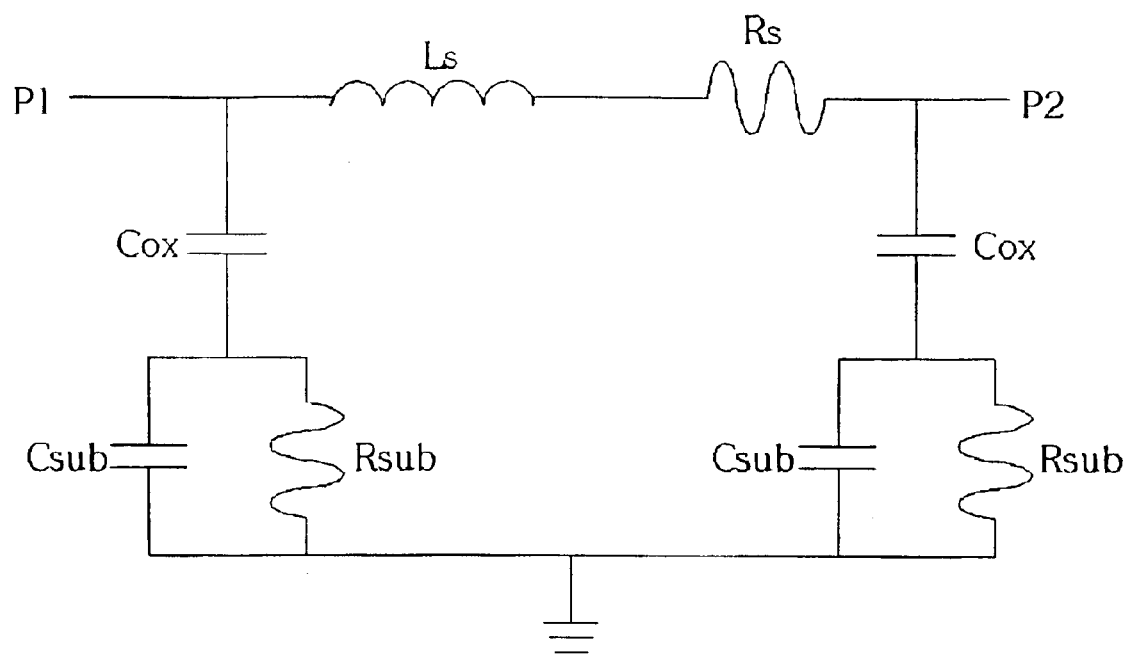
FIG. 3 is a schematic diagram of an equivalent circuit of the silicon substrate inductor shown in FIG. 1.
Figure 4:
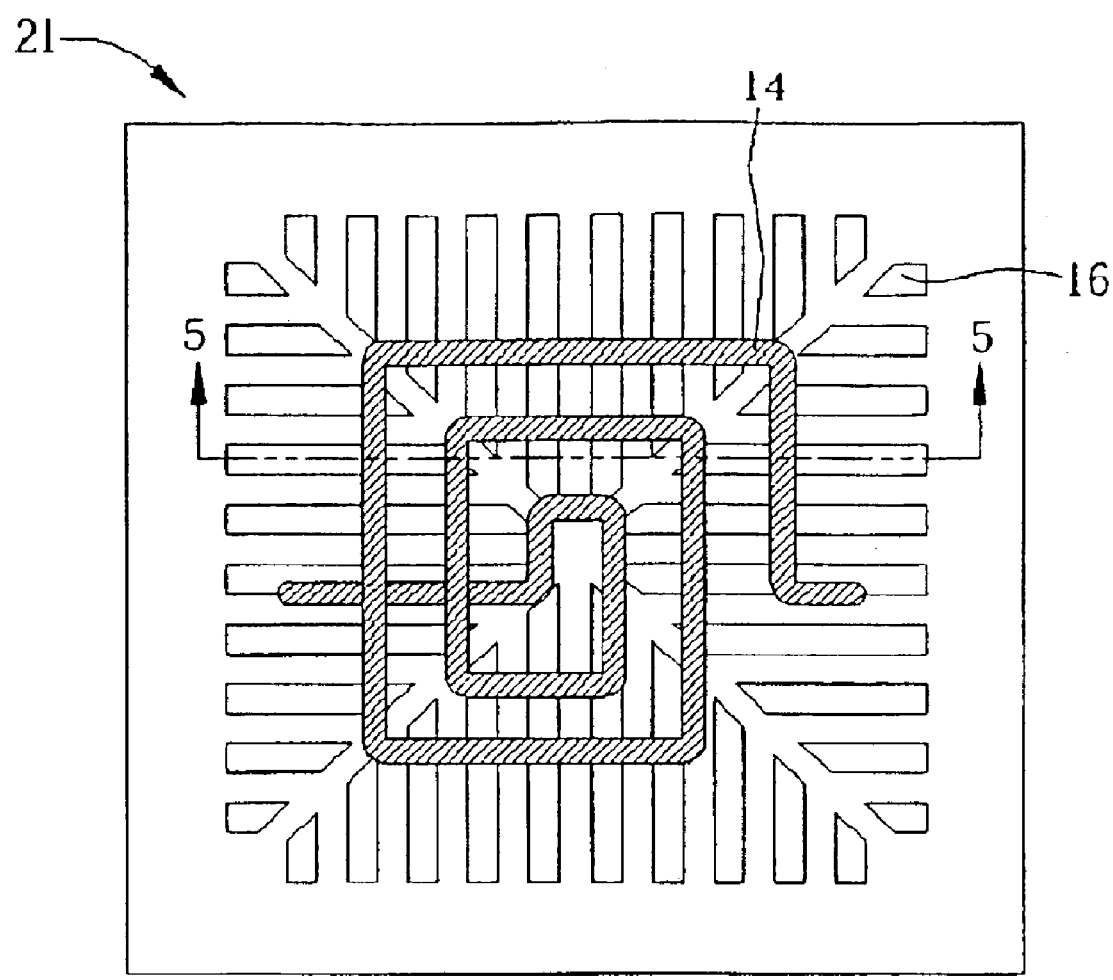
FIG. 4 is a schematic diagram of a patterned ground shield (PGS) inductor.
Figure 5:
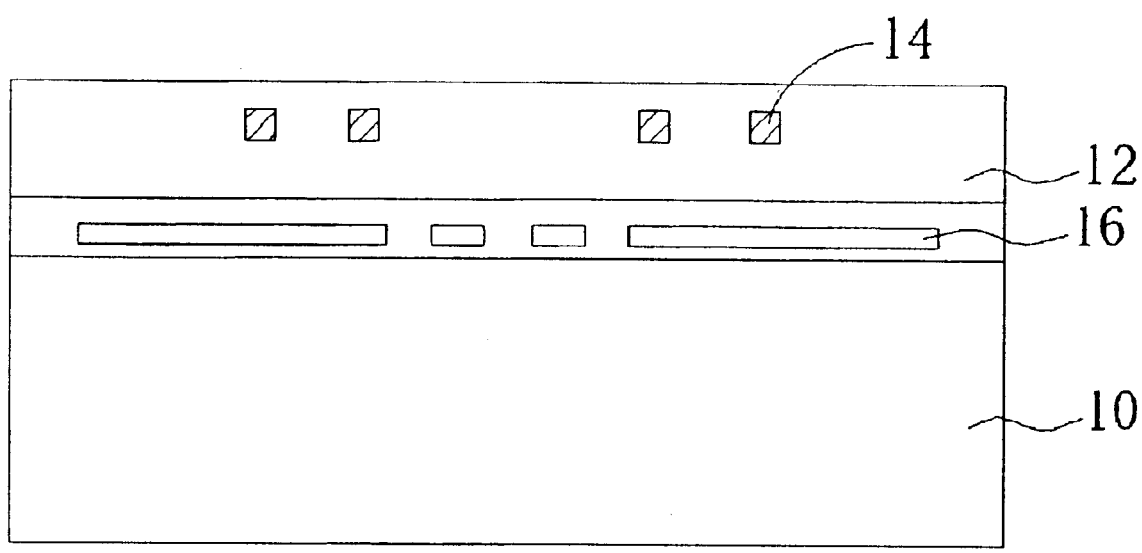
FIG. 5 is a cross-sectional diagram of the inductor shown in FIG. 5 along line 5—5.
Figure 6:
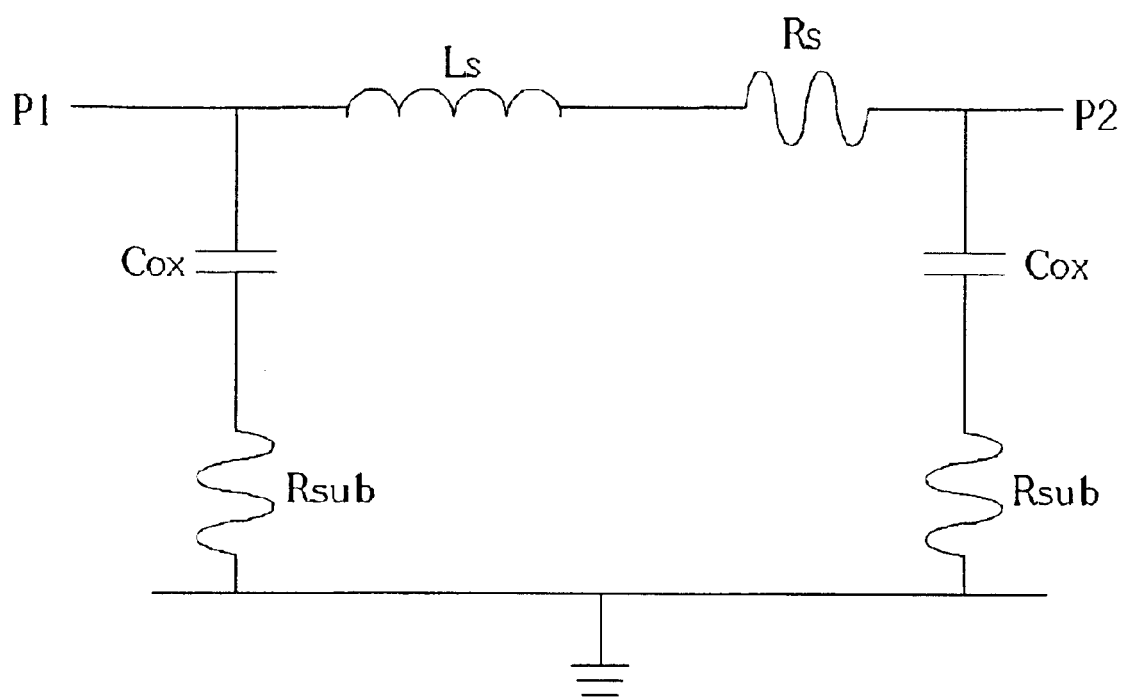
FIG. 6 is a schematic diagram of an equivalent circuit of the inductor shown in FIG. 4.
Figure 7:
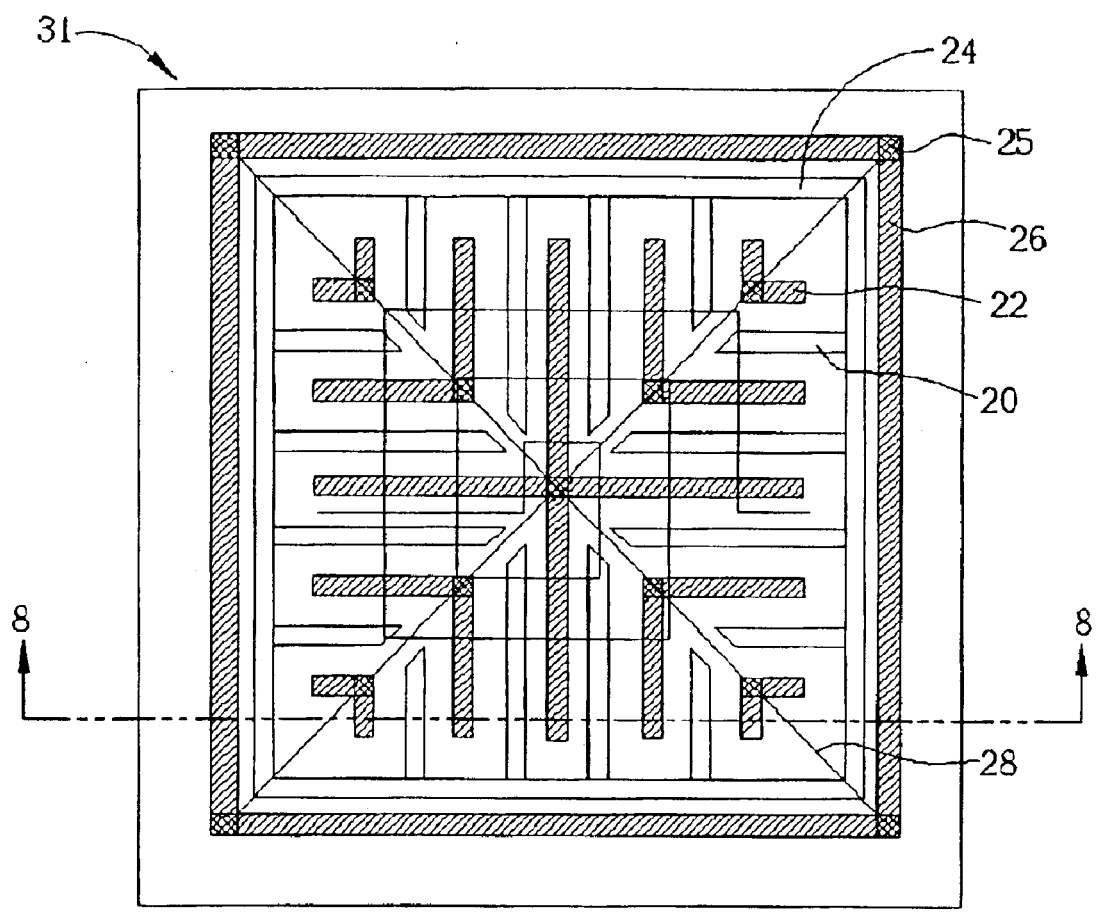
FIG. 7 is a schematic diagram of a low substrate loss inductor of the present invention.
Figure 8:
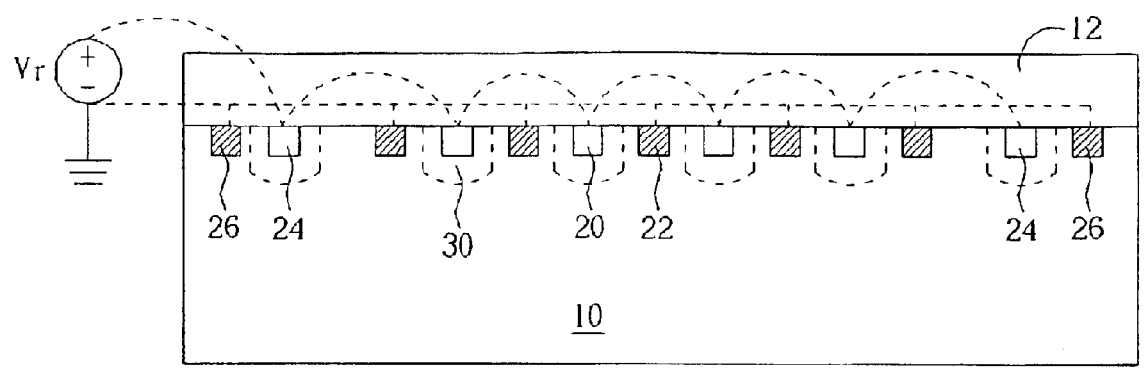
FIG. 8 is a cross-sectional diagram of the inductor shown in FIG. 7 along line 8—8.

Please refer to FIG. 7 and FIG. 8. FIG. 7 is a schematic diagram of a low substrate loss inductor 31 of the present invention. FIG. 8 is a cross-sectional diagram of the inductor 31 shown in FIG. 7 along line 8—8. The low substrate loss inductor 31 of the present invention is formed on a P-type substrate by a n+ doping strip 20 and a p+ doping strip 22 composed of high concentration N-type and P-type dopants. The n+ doping strip 20 comprises a plurality of n+ banded conductive wires, and the p+ doping strip 22 comprises a plurality of p+ banded conductive wires. The banded conductive wires of the n+ doping strip 20 and the p+ doping strip 22 are arranged alternately, that means a p+ banded conductive wire is between any two n+ banded conductive wires, and a n+ banded conductive wire is between any two p+ banded conductive wires. In addition, each conductive wire is separated by a trench. An isolation layer is formed over the n+ doping strip 20 and the p+ doping strip 22 to isolate the inductor 14 formed by a metal coil. In this embodiment, the inductor 14 can be any winding of a balanced-unbalanced transformer (BALUN).

As shown in FIG. 7, the PGS is carried out by the n+ doping strip 20 and the p+ doping strip 22 composed of high concentration N-type and P-type dopants, and the banded conductive wires arranged alternately are orthogonal to the direction of current flow of the inductor 14. The current flow of the inductor 14 would generate a magnetic field that will pass through the substrate 10 and produce an image current flowing conversely. The image current results in energy loss, thus the banded conductive wires of the n+ doping strip 20 and p+ doping strip 22 are used to avoid the image current on the substrate 10 generated by the magnetic field of the inductor 14.

The prior art uses a polysilicon or a metal layer to carry out the PGS 16, which would increase the parasitic capacitance below the inductor 14 and decrease the self-resonance frequency of the inductor 14. In the present invention therefore, a depletion region is generated in the p-n junction between the n+ doping strip 20 and the P-type substrate 10. Also, for controlling the depth of the depletion region, a reverse bias voltage is applied between the n+ doping strip 20 and the p+ doping strip 22 as shown in FIG. 8, which means the n+ doping strip 20 is connected to a high voltage, while the p+ doping strip 22 is connected to a low voltage (usually grounded). In this case the depth of the depletion region 30 in the p-n junction of the substrate 10 can be controlled. The depletion region 30 comprises a depletion capacitance connected to the parasitic capacitance between the substrate and the inductor in series, so the integrated equivalent capacitance is reduced. Moreover, the PGS comprises two guard rings 24 and 26 as shown in FIG. 7, wherein the inner ring 24 having the same dopant as the n+ doping strip 20 is connected to the high Voltage, whereas the outer ring 26 having the same dopant as the p+ doping strip 22 is connected to the low voltage. The way to connect the p+ doping strip 22 and the outer ring 26 to the low voltage is with the X-shape metal wire 28 shown in FIG. 7, and the reticulate squares 25 shown in FIG. 7 represent the contacts that the metal wire 28 uses to connect to the p+ doping strip 22 and the outer ring 26.

Figure 9:
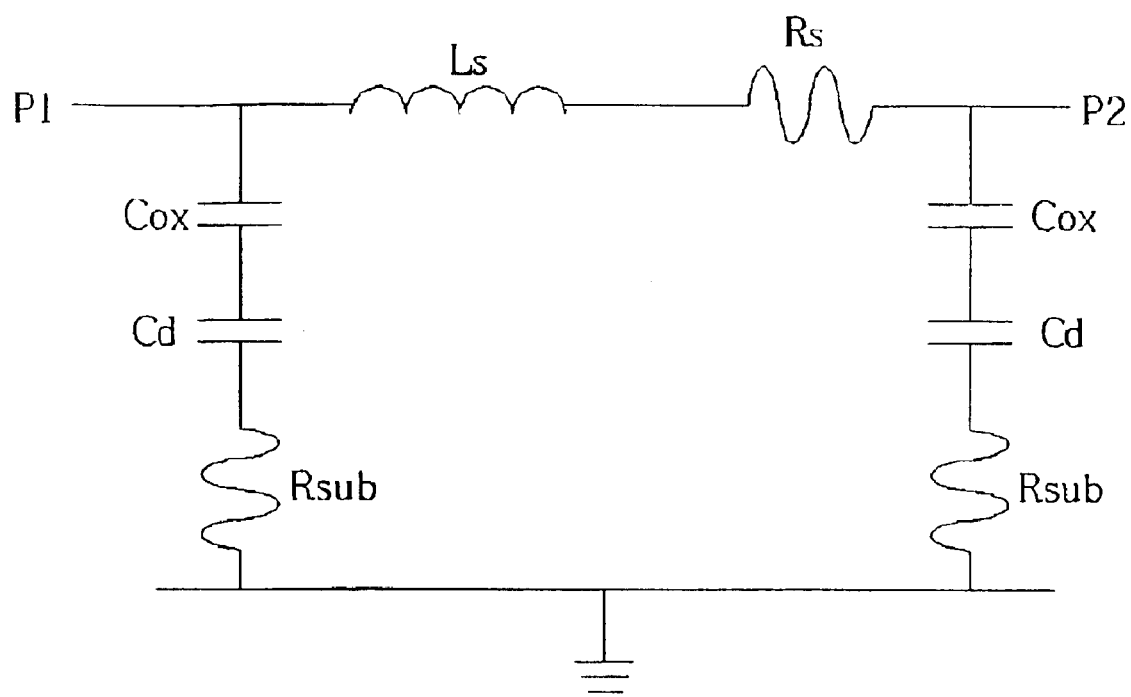
FIG. 9 is a schematic diagram of an equivalent circuit of the low substrate loss inductor shown in FIG. 7.

Please refer to FIG. 9. FIG. 9 is a schematic diagram of the equivalent circuit of the inductor shown in FIG. 7, wherein $L_s$ and $R_s$ represent the inductance and the resistance of the inductor 14 respectively, $C_{ox}$ is the parasitic capacitance between the inductor 14 and the substrate 10, $R_{sub}$ is the resistance generated by the low impedance substrate 10, and $C_d$ is the depletion capacitance generated by the depletion region 30 of the p-n junction. As shown in FIG. 9, because the depletion capacitance $C_d$ and the para sitic capacitance $C_{ox}$ are connected in series, the equivalent capacitance $C_t$ will decrease as shown in following relation:

$$1/C_t = 1/C_{ox} + 1/C_d$$

The depletion capacitance of the depletion region 30 is used to reduce the equivalent parasitic capacitance below the inductor 14, such that the self-resonance frequency of the inductor 14 can be increased and the application range of the inductor 14 can be therefore extended.

Figure 10:
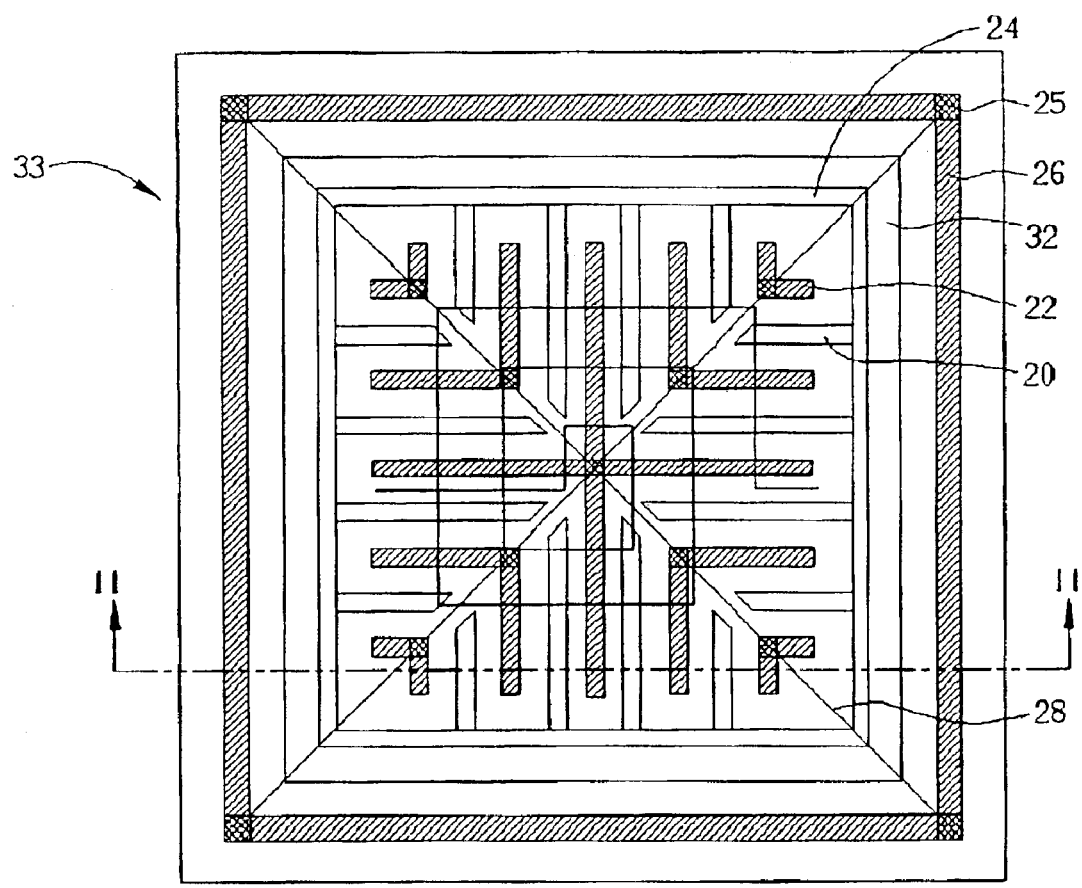
FIG. 10 is a schematic diagram of another low substrate loss inductor of the present invention.

Please refer to FIG. 10, which is a schematic diagram of another low substrate loss inductor 33 of the present invention. As shown in FIG. 10, an N well 32 is formed by low concentration N-type dopants on a surface of the P-type substrate 10, and then a PGS is carried out by an n+ doping strip 20 and a p+ doping strip 22 composed of high concentration N-type and P-type dopants. Wherein the n+ doping strip 20 comprises a plurality of n+ banded conductive wires, and the p+ doping strip 22 comprises a plurality of P+ banded conductive wires. The banded conductive wires of the n+ doping strip 20 and the p+ doping strip 22 are arranged alternately, that means a p+ banded conductive wire is between any two n+ banded conductive wires, and a n+ banded conductive wire is between any two p+ banded conductive wires. In addition, each conductive wire is separated by a trench. The direction of the banded conductive wires of the n+ doping strip 20 and the p+ doping strip 22 is orthogonal to the direction of the current flow of the inductor 14, and a magnetic field generated by the inductor 14 will pass through the substrate 10 and produce an image current flowing reversely. The function of the banded conductive wires is to avoid the image current generated on the substrate 10 by the magnetic field of the inductor 14.

Figure 11:
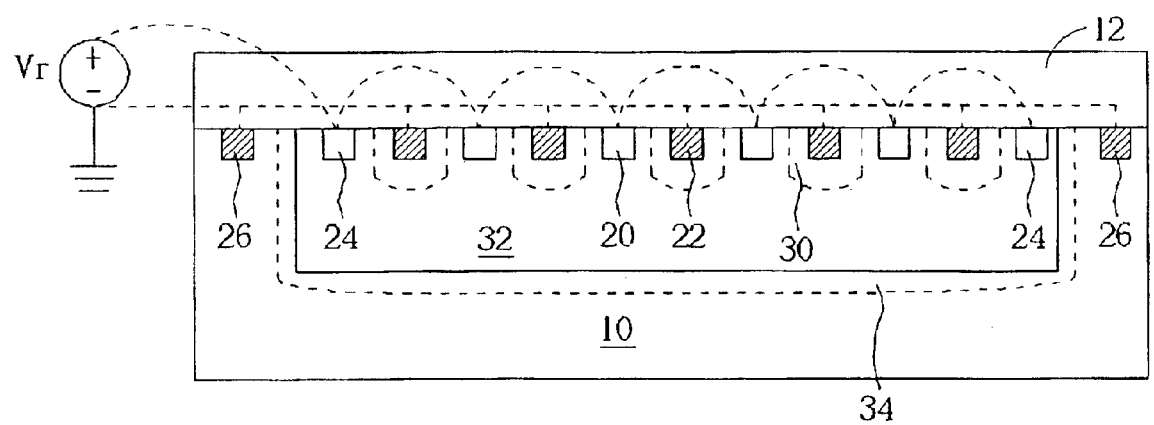
FIG. 11 is a cross-sectional diagram of the inductor shown in FIG. 10 along line 11—11.

Please refer to FIG. 11. FIG. 11 is a cross-sectional diagram of the inductor shown in FIG. 10 along line 11—11. In the prior art, because the PGS 16 carried out by a polysilicon or a metal layer would increase the parasitic capacitance below the inductor 14, the self-resonance frequency of the inductor 14 is decreased. For reducing the equivalent parasitic capacitance below the inductor 14, a depletion region 30 is formed in the p-n junction between the p+ doping strip 22 and N well 32 in the second embodiment of the present invention. The depletion region 30 comprises a depletion capacitance that is connected to the parasitic capacitance between the substrate 10 and the inductor 14 in series, so the equivalent capacitance is reduced. As shown in FIG. 11, a reverse bias voltage is applied between the n+ doping strip 20 and the p+ doping strip 22, which means the n+ doping strip 22 is connected to a high voltage and the p+ doping strip 22 is connected to a low voltage (generally grounded). In this case the depth of the depletion region 30 can be controlled by the reverse bias voltage. In addition, the depletion region 34 formed in the p-n junction between the N well 32 and the P-type substrate 10 can isolate the inductor 14 and other circuits for avoiding interference.

As shown in FIG. 10, the PGS also comprises two guard rings, wherein the inner ring 24 having the same dopants as the n+ doping strip 20 is connected to the high voltage, whereas the outer ring 26 having the same dopants as the p+ doping strip 22 is connected to the low voltage. What is different from FIG. 7 is the inner ring 24 is inside the N well 32 and the outer ring 26 is outside the N well 32. The way to connect the p+ doping strip 22 and the outer ring 26 to the low voltage is with the X-shape metal wire 28 shown in FIG. 10, and the reticulate squares 25 shown in FIG. 10 represent the contacts that the metal wire 28 uses to connect to the p+ doping strip 22 and the outer ring 26.

It can be seen that in two embodiments of the present invention, low substrate loss inductors are carried out by a low cost silicon substrate and standard complementary metal oxide semiconductors (CMOS), therefore the chip cost is reduced while the process technology remains the same. In the low substrate loss inductor of the present invention, a PGS formed by high concentration N-type and P-type dopants can avoid the image current generated by the magnetic field of the inductor 14 on the substrate 10, further reduce the energy loss on the substrate 10, and increase the quality factor of the inductor 14. A reverse bias voltage is applied between the n+ doping strip 20 and the p+ doping strip 22 to control the depth of the depletion region 30 in the p-n junction of the substrate 10. The depletion capacitance of the depletion region 30 can reduce the equivalent parasitic capacitance below the inductor 14, and increase the self-resonance frequency and application range of the inductor 14. Moreover, one of the doping strips in PGS has the same dopants as the substrate 10, such as the p+ doping strip 22 of the P-type substrate 10 or the n+ doping strip 20 of the n well 32, so that the potential can be equally distributed.

In contrast to the prior art, the inductor of the present invention uses high concentration N-type and P-type doping strips to carry out the PGS so that the energy loss caused by the image current generated by the magnetic field of the inductor can be avoided. Further, the problem of reduction of the self-resonance frequency of the inductor because of the PGS being composed of a polysilicon or a metal layer can be solved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An inductor comprising:

a substrate;

a plurality of P-type and N-type doping strips alternatively formed inside the substrate;

an N-type inner doping ring bounding the P-type and N-type doping strips;

a P-type outer doping rind bounding the N-type inner doping ring;

an insulation layer formed on the substrate; and a metal coil formed on the insulation layer;

wherein the insulation layer isolates the metal coil and the plurality of P-type and N-type doping strips, and said doping strips are arranged orthogonal to the metal coil.

2. The inductor of claim 1 wherein the plurality of P-type and N-type doping strips is formed as a patterned ground shield (PGS).

3. The inductor of claim 2 wherein the plurality of P-type doping strips and the P-type outer doping ring are connected to a low voltage and the plurality of N-type doping strips and the N-type inner doping ring are connected to a high voltage to increase the depletion region of the P-N junction.

4. The inductor of claim 1 wherein the metal coil is a coil of a transformer.

5. The inductor of claim 4 wherein the transformer is a balanced-unbalanced transformer (BALUN).

6. The inductor of claim 1 wherein the substrate is a P-type substrate.

7. The inductor of claim 6 further comprising an N well formed in the substrate, and the plurality of P-type and N-type doping strips being formed inside the N well.

8. An inductor comprising:

a first type substrate;

an second type well formed on the first type substrate;

a plurality of first type and second type doping strips alternatively formed in the second type well;

an insulation layer formed on the substrate; and a metal coil formed on the insulation layer;

wherein the insulation layer isolates the metal coil and the plurality of first type and second type doping strips, and said doping strips are arranged orthogonal to the metal coil.

9. The inductor of claim 8 wherein the first type doping strips are P-type doping strips, and the second type doping strips are N-type doping strips.

10. The inductor of claim 9 wherein the plurality of P-type doping strips is connected to a low voltage and the plurality of N-type doping strips is connected to a high voltage to increase the depletion region of the P-N junction.

11. The inductor of claim 10 further comprising an N-type inner doping ring connected to the high voltage and formed on the outside of a patterned ground shield (PGS) formed by the plurality of P-type and N-type doping strips, and a P-type outer doping ring connected to the low voltage and formed on the outside of the N-type inner doping ring.

12. The inductor of claim 8 wherein adjacent strips of the plurality of first type and second type doping strips are substantially separated from each other by material of the second type well.

13. An inductor comprising:

a P-type substrate;

an N well formed in the substrate;

a plurality of P-type and N-type doping strips alternatively formed inside the N well;

an insulation layer formed on the substrate; and a metal coil formed on the insulation layer;

wherein the insulation layer isolates the metal coil and the plurality of P-type and N-type doping strips, and said doping strips are arranged orthogonal to the metal coil.

14. The inductor of claim 13 wherein the plurality of P-type and N-type doping strips is formed as a patterned ground shield (PGS).

15. The inductor of claim 14 wherein the plurality of P-type doping strips is connected to a low voltage and the plurality of N-type doping strips is connected to a high voltage to increase the depletion region of the P-N junction.

16. The inductor of claim 15 further comprising an inner ring doping strip that is an N-type doping strip connected to the high voltage formed on the outside of the PGS, and an outer ring doping strip that is a P-type doping strip connected to the low voltage formed on the outside of the inner ring doping strip.

17. The inductor of claim 13 wherein the metal coil is a coil of a transformer.

18. The inductor of claim 17 wherein the transformer is a balanced-unbalanced transformer (BALUN).

19. The inductor of claim 13 wherein adjacent P-type and N-type doping strips of the plurality of P-type and N-type doping strips are substantially separated from each other by material of the N well.

20. The inductor of claim 1 wherein adjacent P-type and N-type doping strips of the plurality of P-type and N-type doping strips are substantially separated from each other by material of the substrate.

* * * * *